United States Patent [19]
Potter

[11] Patent Number: 4,777,429
[45] Date of Patent: Oct. 11, 1988

[54] TEST ARRANGEMENT

[75] Inventor: Christopher M. Potter, Stevenage, United Kingdom

[73] Assignee: Marconi Instruments Limited, Hertfordshire, England

[21] Appl. No.: 105,576

[22] Filed: Oct. 8, 1987

[30] Foreign Application Priority Data

Oct. 21, 1986 [GB] United Kingdom ............... 8625154

[51] Int. Cl.[4] ............................................. G01R 27/04
[52] U.S. Cl. ............................. 324/58.5 B; 324/58 B
[58] Field of Search ........... 324/58 B, 58.5 R, 58.5 A, 324/58.5 B, 58 A, 58 R

[56] References Cited

U.S. PATENT DOCUMENTS 4,521,728 6/1985 Li ..................................... 324/58.5 R
4,641,082 2/1987 Griffin et al. ..................... 324/58 B

FOREIGN PATENT DOCUMENTS 2100526 12/1982 United Kingdom .

OTHER PUBLICATIONS

Hoer article "A Network Analyzer Incorporating Two Six-Port Reflectometers" IEEE Transactions on Microwave Theory and Technique, vol. MTT-25, No. 12, Dec. 1977.

Electronic Letters, vol. 21, No. 4, Feb. 14th, 1985, p. 157, Stevenage, Herts, GB; J. D. Hunter et al., "S-Parameter Measurements With a Single Six-Port.

*Primary Examiner*—Reinhard J. Eisenzopf
*Assistant Examiner*—Maura K. Regan

[57] ABSTRACT

A six-port network for characterizing a microwave or R.F. device includes a signal source (1) capable of generating three signals of the same frequency but relative phase differences, and combines each of the signals with a signal reflected or transmitted by the device. Two three-phase sources may be used in a dual six-port network device.

9 Claims, 4 Drawing Sheets

TEST ARRANGEMENT

This invention relates to a test arrangement which is suitable for performing electrical maasurements on high frequency electrical devices. The invention is intended for operation in the radio frequency or microwave frequency range.

One of the most powerful techniques used to characterise radio frequency (RF) and microwave components is the Scatterinq parameter (or S-Parameter) model. The RF device is treated as a "black box" with various input and output terminals. Each pair of terminals is termed a "port". The device's performance is quantified by applying a wave to one port and recording the emergent waves at each port caused by that wave. The relationships between the waves are expressed in a matrix of complex coefficients, called the S-parameter matrix.

These complex coefficients can be measured by means of a network analyser which separates out the required waves and evaluates their complex relationship. Automatic network analysers have been developed in which the frequency of a variable oscillator is controlled over a particular frequency band. These analysers are very complex involving directional couplers or bridges to sample the incident and reflected waves. The samples are then ratioed to find the magnitude and phase of the reflection coefficient. This is a complicated step in practice, as phase angles cannot be directly measured at frequecies higher than about 500 kHz. Therefore, the system has to convert the RF samples down to a suitable frequency before measuring them. To do this while accurately maintaining their amplitude and phase relationships is both difficult and expensive. Mixers or samplers used in such a heterodyne system must be extremely linear.

An arrangement known as a Six-port Network Analyser relies on the use of amplitude measurements, without the need to measure phase information, and is able to use relatively simple RF circuitry, providing that the Six-port Network Analyser can be accurately calibrated.

Our co-pending patent applications Nos. 8,601,108 (GB 2185582A) and 8,609,227 (GB No. 2185583A) describe a six port network analyser and a technique for calibrating such a system.

In a six port reflectometer, the six ports are used as follows:

Port 1 receives an incident signal A applied by an RF source to the device under test; Port 2 is a test port for applying signal A to the device and receiving a reflected signal B; Port 3 samples mainly the signal A and Ports 4, 5 and 6 sample different combinations of the signals A & B. The six port junction is designed to split source power between the device under test (DUT) and the four detector ports and to sample the reflected wave from the DUT in order to pass it to three of the detector ports. From measurements of the sampled signals it is possible to characterise the DUT and obtain values of its 'S' parameters.

The six port network is responsible for providing the correct phase and amplitude balance of the "A" and "B" wave samples when they reach the four detectors. This has previously been done using standard microwave components such as couplers, hybrids, lengths of transmission line, voltage probes, resonant cavities, etc. Such systems are therefore limited in the frequency range they can deal with and can be complex and bulky.

According to the present invention there is provided a test arrangement including a six port reflectometer having a test port connectable to a device under test; a signal source providing three output signals having the same frequency but relative phase differences; means for combining respective ones of the three signals with a signal obtained at the test port by reflection from a device under test; and power meters for utilising the three combined signals and one of the output signals to test the device.

The signal source may be arranged such that the frequency of the three output signals is variable whilst the relative phases remain constant.

In typical embodiments the bandwidth could be from 1 MHz to 1 GHz, or even larger.

Preferably, the signal source provides three high frequency output signals having the same frequency but relative phase differences of 120°.

It has been shown in the above mentioned co-pending patent applications, which are incorporated herein by reference, that in a six-port device the output from each of the four detectors may be geometrically interpreted as circles on the complex plane intersecting at a point $\Gamma$ where $\Gamma$ is defined as $$\frac{\text{reflected wave}}{\text{incident wave}}$$

Greatest accuracy is achieved if the centres of these circles are spaced as far apart from each other as possible so that errors in power meter readings do not cause significant errors in the measurement of $\Gamma$. Hence, ideally the centres of the circles should be placed 120° apart and this is achieved simply but effectively in the present invention.

The use of the three-phase signal source removes the need for qudrature couplers, etc, and, as the power splitting and combining can be achieved using resistive components, the arrangement operates over an extremely broad frequency range. The signal source itself can easily be constructed such that it likewise is able to operate over a very wide frequency band.

The test arrangement may include two six-port reflectometers, to enable the transmission parameters as well as the reflection parameters of two-part DUT's to be fully characterised.

The present invention is particularly applicable at sub-microwave frequencies (less than 1 GHz) where the microwave components would become extremely large due to the size of the wavelength, since the length of a coupler applicable to a particular frequency is proportional to the wavelength.

Embodiments of the invention will now be described by way of example only with reference to the accompanying drawings in which.

Figure 1:
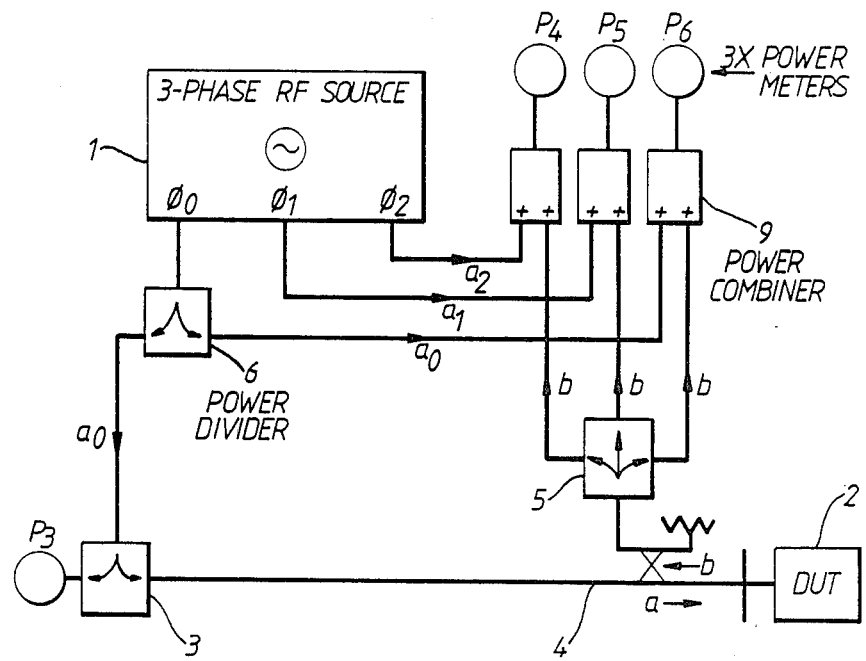
FIG. 1 shows one embodiment of a test arrangement.

Referring to FIG. 1 there is shown a six-port reflectometer connected to a three phase RF source 1 and also to a device under test (DUT) 2. By convention, six-port reflectometers are labelled with ports P1 to 6 and in the Figure Port $P_1$ is not shown but is the input port to which the three source signals $a_o$, $a_1$ and $a_2$, having relative phases $\phi0$, $\phi1$, $\phi2$ respectively, are applied. $P_2$ is the port to which the DUT 2 is connected. A splitter 3 is connected to Port $P_3$ and serves to provide a sample of source signal $a_o$ to a power meter at $P_3$. A directional coupler 4 is provided at Port 2 to allow incident signals A to be transferred to the DUT and reflected signals B to be transferred to a three-way splitter 5 and from there on to power meters at Ports $P_4$, $P_5$ and $P_6$. At respective ones of these three Ports the signal B is combined in a power combiner with one of the different phase outputs, $a_2$, $a_1$ and $a_o$ from RF source 1. A sample of signal $a_o$ is fed to port $P_6$ by a further power divider 6. The power combiners and dividers used in the apparatus may use straightforward and well-known RF circuitry.

Figure 2:
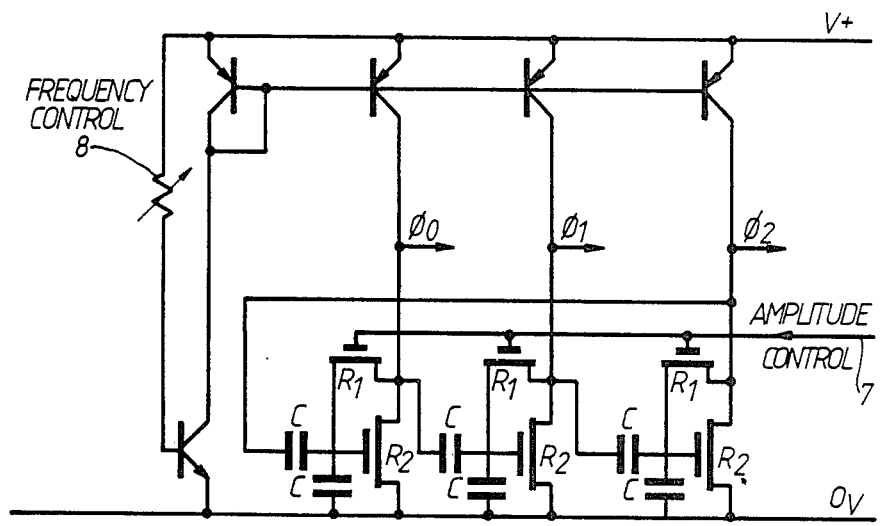
FIG. 2 shows a signal source capable of operating over a wide frequency range.

It is seen that in this apparatus the three phase source 1 is used to provide three phase shifts of the A wave, which is summed with an unshifted sample of the B wave. Although any arbitrary phase differences between the samples $a_o$, $a_1$ and $a_2$ could be achieved, it has been shown that the three samples should be as far apart in phase as possible and hence in this embodiment $\phi0-\phi1=\phi1-\phi2=\phi2-\phi0=120°$. The oscillator is therefore made from three identical phase shifters such that the total phase shift around the loop is 360° and hence the phase shift between each stage is 120°. A signal source suitable for this is shown in FIG. 2. It should be noted that any type of three-phase source may be suitable, even three phase mains at 50 Hz. For such a system, the power combiners could be simple op-amp networks. Any minor variations in phase shift from 120° does not significantly affect measurement accuracy, since the six-port calibration scheme accounts for such departures from ideality.

A typical signal source of conventional construction is shown in FIG. 2. The source uses resistive components, which can be made to cover an extremely broad frequency range. An RC type of frequency control is used, where the capacitance C is fixed and the resistance R is the output impedance of an amplifying stage. Three amplifying stages are used in the circuit to obtain the three output signals with relative phases $\phi0$, $\phi1$ and $\phi2$.

Two RC stages are used in each amplifying stage, the capacitance being provided by capacitors C and the resistance being provided by the output impedance of FET's shown as $R_1$ and $R_2$. The impedance of the three FETs labelled $R_1$ can be adjusted by means of the amplitude control 7 to adjust the loop gain. This is done to avoid clipping of the signal, since it is important that pure sine waves are obtained in order to avoid the generation of harmonics and to ensure that any frequency-dependent effects due to the DUT's response to harmonics are avoided. Tuning of the system is achieved by varying the frequency control resistor 8 which serves to alter the operating point of the amplifying FETs.

A current mirror arrangement is used to set the quiescent current in each output stage. When there is a small current flow, a FET has a high output impedance, and when there is large current flow, the output impedance is low. The frequency of oscillation is proportional to the output impedance of the amplifiers and hence the bandwidth of the power source is dependent upon the range of output impedance which can be obtained. This may be between 10Ω and 10 MΩ, corresponding to a $10^6$:1 bandwidth.

Typically, the power circuit shown in FIG. 2 will be used to provide a three phase source, with 120° phase separation over a bandwidth of 1 MHz to 1 GHz. A typical six-port network fabricated from 3 dB hybrid couplers, would not be feasible over this large bandwidth and will generally only have a 30:1 bandwidth. As an example, a hybrid coupler at 1 MHz would need a length of approximately 2.5 m and hence a conventional six port network would be impractical at such a frequency. The working frequency of apparatus similar to that shown in FIG. 2 is limited only by RF circuit technology and components are easily available which could enable a frequency range of, say, from 10 KHz to 2 GHz or even wider.

Figure 3:
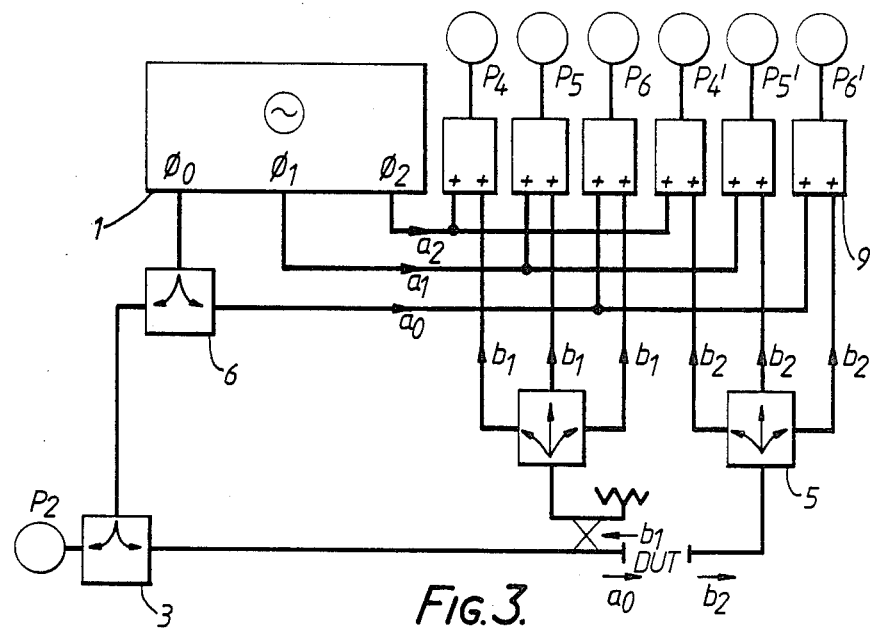
FIG. 3 shows a one path dual six port test arrangement

In the above referenced co-pending patent applications, it is described how, in order to fully characterise a DUT, a dual configuration of six port network analysers is required. FIG. 3 shows an example of the application of the three phase signal source to a dual six port network. The signal incident on the DUT is shown as $a_0$, the reflected signal shown as $B_1$ and the transmitted signal as $B_2$. In most respects this apparatus is similar to that of FIG. 1 and similar parts are given the same reference numeral. In this case, however, three additional ports are required, $P_4'$, $P_5'$ and $P_6'$. The three phase signals $a_0$, $a_1$ and $a_2$ are combined not only with respective samples of the reflected wave $B_1$ but also with samples of the transmitted wave $B_2$. A sample of $B_2$ is combined with $a_0$, $a_1$ or $a_2$ and measured by respectively power meters $P_6'$, $P_5'$ and $P_4'$. By measuring the reflection and transmission characteristics of the DUT its parameter can be evaluated as is described in our previously mentioned co-pending patent applications.

Figure 4:
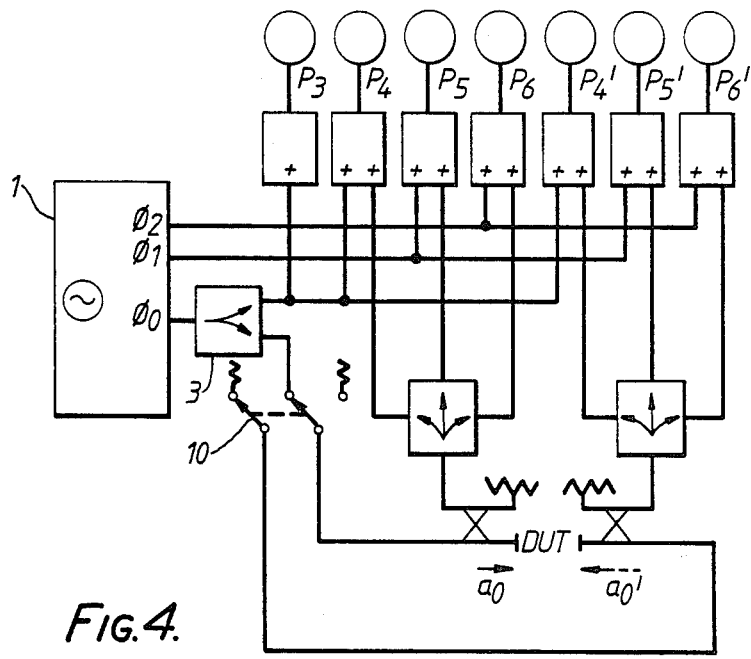
FIGS. 4 & 5 show two switched dual six-port test arrangements.

Since a two port device under test may exhibit different forward and reverse characteristics, that is, have different characteristics depending upon the port to which a test signal is applied, it may be useful to provide a test arrangement, the test signal of which may be applied to each port of a DUT in turn: One system for achieving this is shown in FIG. 4 in which a switch 10 is used to alternate the test signal between the two ports of the DUT. When the switch is in the position shown, the apparatus operates in a fashion identical to that of the apparatus in FIG. 3 in which signal $a_0$ is applied to the DUT and $B_1$ and $B_2$ measured as before. When the switch 10 is at its alternative position, a signal $a_o$, is applied to the other port of the DUT and the output signals $B_1$ and $B_2$ are reversed with respect to FIG. 3. In this way, the full matrix of S parameters characterising the DUT may be found by alternating the test signal between the two ports of the DUT.

A problem with the apparatus of FIG. 4 is that any non-repeatability of the switch will cause a change in the phase relationship between the output $a_0$ used to test the DUT and the other two outputs $a_1$ and $a_2$ of the three phase source 1. The switch may introduce slight phase shifts in signal $a_0$ which may vary with each operation of the switch. This effect cannot be easily accounted for, although at frequencies less than 1 GHz the errors can be made small. Two alternative dual port arrangements for performing the same unction are shown in FIGS. 5 and 6.

Figure 5:
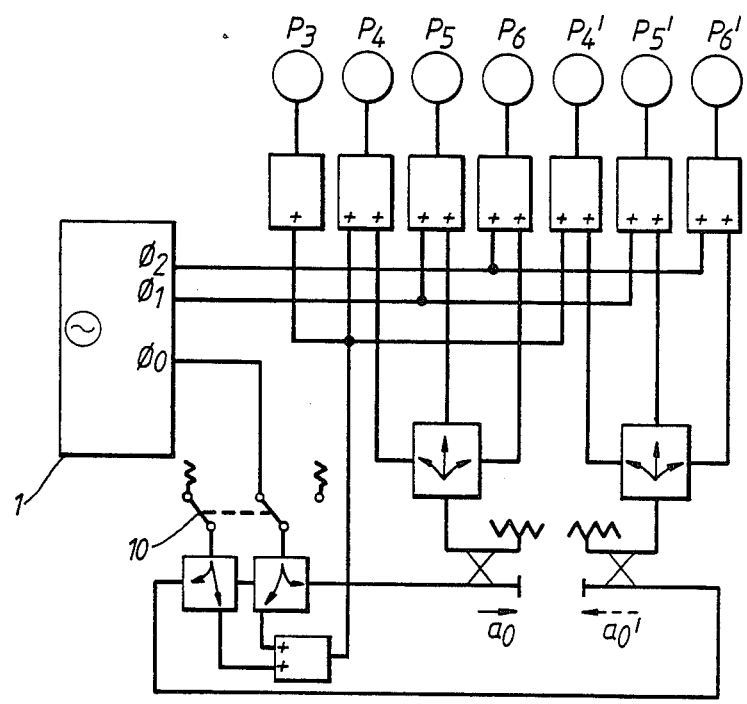

The arrangement shown in FIG. 5 improves on the arrangement of FIG. 4 by sampling $a_o$ and $a_o'$ after the switch, thus minimising the error due to switch repeatability. However, the problem of maintaining the phase relationship between $a_0$, $a_1$ and $a_2$ still remains.

Figure 6:
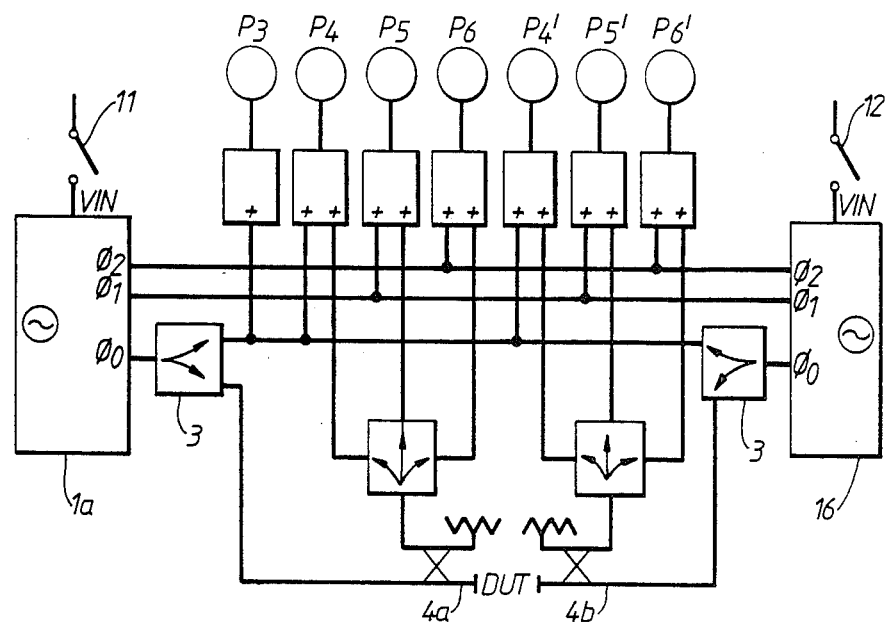
FIG. 6 shows a dual six-port test arrangement having two separate signal sources.

The arrangement shown in FIG. 6 includes two three phase sources 1a and 1b. The signal from source 1a may be applied to one side of the DUT and the signal from the second source 1b may be applied to the other measurements and the other one for reverse measurements, side. Hence, one oscillator is used for forward only one oscillator being energised at any one time by means of co-operating switches 11 and 12. This arrangement is an alternative to that of FIGS. 4 and 5 and may be slightly more accurate since the phase differences can be better controlled although the system of FIG. 6 may be more expensive due to the use of two oscillators.

Figure 7:
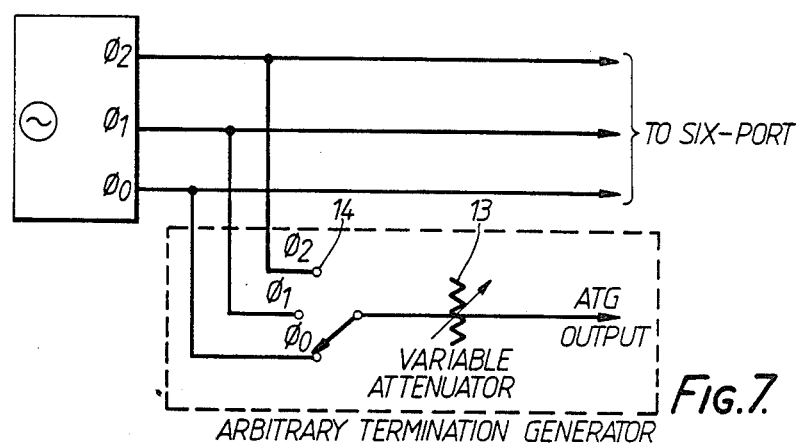
FIG. 7 shows a calibrating apparatus for the test arrangement.

In our co-pending application No. 8609227 it is described how the calibration of dual six port networks is carried out in two stages. In the first stage, the six port network is reduced to four ports, that is to say the number of unknown coefficients in the system is reduced to the number associated with four port networks. In order to achieve this six to four port reduction, theory requires the connection of several different loads to the test port. These may all be passive loads, i.e., ones in which $|\Gamma| \leq 1$ or, better still, the loads may be a mixture of passive and active loads; an active load being one in which $|\Gamma| > 1$, i.e. in which more power is reflected than is incident upon a port. It is shown in the above mentioned patent application that an arbitrary termination generator may be used to provide a series of loads for such calibration. With a conventional six-port network, such an arbitrary termination generator includes a variable attenuator and variable phase shifter to give a wide range of terminations, both active and passive. Referring to FIG. 7, an arbitrary termination generator for use with apparatus according to the present invention includes a variable attenuator 13 as in the previous generator. However, instead of a variable phase shifter the three power outputs $a_0$, $a_1$ and $a_2$ from RF source 1 are used through a switch 14 to provide phase loads of different phases. It is therefore simpler in design and easier to implement than a generator as used with previous six port network systems During the six to four port reduction stage the termination generator is arranged to provide several arbitrary reflections. Subsequently, during a second stage of calibration in which the "reduced" four port network is calibrated, it is used to provide several arbitrary transmissions.

I claim:

1. A test arrangement including a six-port reflectometer having a test port connectable to a device under test; a signal source providing three output signals having the same frequency but relative phase differences; means for combining respective ones of the three signals with a signal obtained at the test port by reflection from a device under test; and power meters for utilising the three combined signals and one of the output signals to test the device.

2. A test arrangement as claimed in claim 1 wherein the signal source is adapted such that the frequency of the three output signals may be varied whilst the relative phases remain substantially constant.

3. A test arrangement as claimed in claim 1 wherein each output signal has a relative phase difference of substantially 120° with each of the other two signals.

4. A test arrangement as claimed in claim 1, adapted to operate over a frequency range between 1 MHz and 1 GHZ.

5. A test arrangement as claimed in claim 1 and further including a second test port connectable to the device under test; means for combining respective ones of the three signals with a signal obtained at the second test port by transmission or reflection from the device under test and further power meters for utilising the three resulting combined signals to further test the device.

6. A test arrangement as claimed in claim 5 wherein the signal source is connected via switch means to both test ports such that a test signal may be selectively applied to either port.

7. A test arrangement as claimed in claim 1 including a second test port connectable to the device under test, a second signal source providing three output signals having the same frequency but relative phase differences; means for combining respective ones of these three output signals with a signal obtained at the second test port by reflection from the device under test, further power meters for utilising the three resulting combined signals to further test the device and switch means for actuating a selected one of the first or second signal sources.

8. A test arrangement as claimed in claim 1 wherein the signal source is composed of resistive components.

9. A test arrangement as claimed in claim 1, including an arbitrary termination generator comprising: inputs from each of the three outputs from the signal source and a variable attenuator switchably connected to the inputs so as to select one of the inputs at any one time.

* * * * *